US007965131B2

(12) United States Patent
Tomita

(10) Patent No.: US 7,965,131 B2
(45) Date of Patent: Jun. 21, 2011

(54) BIAS VOLTAGE GENERATION CIRCUIT AND DRIVER INTEGRATED CIRCUIT

(75) Inventor: Shunichi Tomita, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 122 days.

(21) Appl. No.: 12/511,327

(22) Filed: Jul. 29, 2009

(65) Prior Publication Data

US 2010/0039169 A1 Feb. 18, 2010

(30) Foreign Application Priority Data

Aug. 18, 2008 (JP) ................................ 2008-209660

(51) Int. Cl.
*G05F 3/08* (2006.01)
*H03M 1/68* (2006.01)
*G09G 3/34* (2006.01)

(52) U.S. Cl. .......... 327/538; 341/144; 345/98; 345/212

(58) Field of Classification Search ........................ None
See application file for complete search history.

(56) References Cited

U.S. PATENT DOCUMENTS 5,568,146 A * 10/1996 Park .............................. 341/145
6,674,420 B2 * 1/2004 Matsueda et al. ............... 345/87
7,750,900 B2 * 7/2010 Tsuchi et al. ................. 345/210

FOREIGN PATENT DOCUMENTS

JP 3172906 7/1991
JP 2001-216034 8/2001
JP 2008-209660 8/2008
JP 2010-044686 A 2/2010

* cited by examiner

*Primary Examiner* — Lincoln Donovan
*Assistant Examiner* — Terry L Englund
(74) *Attorney, Agent, or Firm* — Taft Stettinius & Hollister LLP

(57) ABSTRACT

A bias voltage generation circuit includes a data holding section, a correction value storage section, a computing circuit, a voltage dividing circuit and a selection circuit. The data holding section holds a variable n-bit data value that is set from an exterior, wherein n is a positive integer. The correction value storage section stores an n-bit correction value for correcting the n-bit data value. The computing circuit computes the n-bit data value and the n-bit correction value, and outputs an n-bit computing result. The voltage dividing circuit divides a reference voltage into $2^n$ voltages, and outputs $2^n$ levels of divided voltages. The selection circuit selects one level of a divided voltage from the $2^n$ levels of divided voltages on the basis of the n-bit computing result and outputs the selected divided voltage as a bias voltage, the output bias voltage having a variation over $2^n$ levels.

9 Claims, 8 Drawing Sheets

FIG. 5

| NON VOLATILE MEMORY VALUE | COMPUTATION |
|---|---|
| 01111111 | +127 |
| 01111110 | +126 |
| ↓ | ↓ |
| 00000001 | +1 |
| 00000000 | 0 |
| 11111111 | -1 |
| ↓ | ↓ |
| 10000000 | -128 |

FIG. 6

| REGISTER SET VALUE | NON VOLATILE MEMORY VALUE | COMPUTING RESULT |
|---|---|---|
| 00000000 | 00000000 | 00000000 |
| 00000001 | | 00000001 |
| ... | | ... |
| 11111111 | | 11111111 |

FIG. 7

| REGISTER SET VALUE | NON-VOLATILE MEMORY VALUE | COMPUTING RESULT |
|---|---|---|
| 00000000 | 00010000 | 00010000 |
| 00000001 | | 00010001 |
| . . . | | . . . |
| 11101111 | | 11111111 |
| 11110000 | | 00000000 |
| . . . | | |
| 11111111 | | 00001111 |

SINCE 9TH BIT VALUE IS IGNORED IN REGISTER VALUES EQUAL TO OR MORE THAN 11110000, A VALUE SUBTRACTING 240 FROM THE ACTUAL COMPUTING RESULT IS SET AS THE COMPUTING RESULT

FIG. 8

| REGISTER SET VALUE | NON-VOLATILE MEMORY VALUE | COMPUTING RESULT |
|---|---|---|
| 00000000 | 11110000 | 11110000 |
| . . . | | . . . |
| 00001111 | | 11111111 |
| 00010000 | | 00000000 |
| 00010001 | | 00000001 |
| . . . | | . . . |
| 11111111 | | 11101111 |

SINCE THE ACTUAL COMPUTING RESULT OF REGISTER VALUES EQUAL TO OR LESS THAN 00001111 WILL BE BELOW 00000000, A VALUE ADDING 240 TO THE ACTUAL COMPUTING RESULT IS SET AS THE COMPUTING RESULT

BIAS VOLTAGE GENERATION CIRCUIT AND DRIVER INTEGRATED CIRCUIT

CROSS-REFERENCE TO RELATED APPLICATIONS

This application claims priority under 35 U.S.C. §119 from Japanese Patent Application No. 2008-209660 filed on Aug. 18, 2008, the disclosure of which is incorporated by reference herein.

RELATED ART

1. Field of the Invention

The present disclosure relates to a bias voltage generation circuit that generates plural levels of reference voltages (i.e., bias voltages) based on data or value set from an exterior, and a driver integrated circuit including the bias voltage generation circuit, for example, a driver integrated circuit (hereinafter, referred to as a "driver IC") for driving a display device such as a liquid crystal display.

2. Description of the Related Art

Conventionally, techniques relating to a bias voltage generation circuit that generates a reference voltage (i.e., bias voltage) used for an internal circuit in a semiconductor integrated circuit or the like are disclosed, for example, in the following documents. Japanese Patent Application Laid-Open (JP-A) No. 3-172906 discloses a technique of a trimming circuit in which, due to a program setting for plural fuses, an output voltage is outputted based on one voltage selected from a group of plural voltages divided by resistors. JP-A No. 2001-216034 discloses a technique of an internal power supply voltage generation circuit in which a selection circuit is controlled by an on-demand variable control signal or a fixed control signal such as a read only memory (hereinafter, referred to as "ROM"), and a second reference voltage is generated based on a divided voltage that results from the controlling of the selected circuit.

These techniques may be suitable for generating one level of a bias voltage or several levels of bias voltages. However, when a bias voltage generation circuit is provided inside a driver IC driving a display panel such as a liquid crystal display (hereinafter, referred to as "LCD"), it is necessary to generate a number of levels of bias voltages. Therefore, it has been difficult to reduce circuitry scale and electric power consumption. Accordingly, there has been proposed a bias voltage generation circuit, for example as shown in FIG. 10, which may be provided inside an LCD driver.

FIG. 10 is a schematic block diagram of a bias voltage generation circuit in the related art.

The bias voltage generation circuit has a register 1 that holds a variable n-bit (e.g., 8-bit) register value set under control of a control IC (which includes a microprocessor (hereinafter, referred to as "MPU")) for controlling a driver IC, and a resistance-voltage dividing circuit 2 that divides a reference voltage VRS and outputs $2^8$ (=256) levels of divided voltages. A selection circuit 3 is connected to the output sides of both the register 1 and the resistance-voltage dividing circuit 2. The selection circuit 3 is a circuit that selects one level of a divided voltage from 256 levels of the divided voltages based on the 8-bit register value and outputs the divided voltage DV having a variation over 256 levels. An amplifier circuit 4 is connected to the output side of the selection circuit 3. The amplifier circuit 4 is a circuit that amplifies the divided voltage DV and outputs a bias voltage BV.

In this bias voltage generation circuit, one level divided voltage DV is selected at the selection circuit 3, based on a setting of the register 1, from plural levels of voltages divided by the resistance-voltage dividing circuit 2 based on the reference voltage VRS, amplified at the amplifier 4, and as a result the bias voltage BV having a variation over 256 levels is outputted. By varying the register value, the bias voltage BV having a variation over plural levels can be generated by a relatively simple circuit configuration, and thus it is possible to reduce circuitry scale and electric power consumption.

FIG. 11 is a workflow of conventional mass-production and shipping of a driver IC.

For example, a case will be explained in which a driver IC having the bias voltage generation circuit of FIG. 10 is produced at Driver IC-manufacturing company A, and the mass-produced driver IC is shipped to Panel module assembly company B by which panel module is assembled, and the assembled panel module is sold to Panel module purchase company C, and thereafter, delivered to User D such as an equipment manufacturer.

Panel module purchase company C finishes a display panel such as an LCD by combining the purchased panel module with a control IC or the like for controlling a driver IC, and delivers the display panel to User D.

Firstly, Driver IC manufacturing company A prepares various register values for the register 1 in FIG. 10 taking into consideration a type of display panel with which the driver IC is combined, and mass-produces the driver ICs and ships the driver ICs to Panel module assembly company B. Since Panel module assembly company B does not prepare a control IC for controlling the driver IC, Panel module assembly company B is not able to change (correct) the register value set for the register 1 in FIG. 10. Therefore, Panel module assembly company B assembles panel module by simply combining the purchased driver IC with the display panel, and sells the panel module to Panel module purchasing company C.

Panel module purchasing company C sets the register value for the register 1 in FIG. 10 by combining the purchased panel module with a control IC for controlling the driver IC. In this regard, a relatively complicated task of correcting the register value considering a characteristic difference of each display panel is needed. In other words, although a register value is prepared by Driver IC manufacturing company A according to the type of the display panel, it is still necessary to make a slight correction (adjustment) of the register value for each display panel.

Slight adjustment is necessary to the bias voltage for driving (displaying) display panel, for each display panel. Conventionally, this adjustment of the bias voltage is realized by Panel module purchasing company C by changing (correcting) the register value corresponding to each display panel. Thereafter, the finished display panel is delivered to User D.

Thus, in the conventional bias voltage generation circuit as shown in FIG. 10, it is necessary to make an adjustment to the bias voltage required for displaying a display panel, corresponding to each display panel. Accordingly, a complicated task of changing the register value for each display panel was necessary.

INTRODUCTION TO THE INVENTION

An aspect of the disclosure is a bias voltage generation circuit including: a data holding section that holds a variable n-bit data value that is set from an exterior, wherein n is a positive integer; a correction value storage section that stores an n-bit correction value for correcting the n-bit data value; a computing circuit that computes the n-bit data value and the n-bit correction value, and outputs an n-bit computing result; a voltage dividing circuit that divides a reference voltage into $2^n$ voltages, and outputs $2^n$ levels of divided voltages; and a selection circuit that selects one level of a divided voltage from the $2^n$ levels of divided voltages on the basis of the n-bit computing result, and outputs the selected divided voltage as a bias voltage, the output bias voltage having a variation over $2^n$ levels.

BRIEF DESCRIPTION OF THE DRAWINGS

Exemplary embodiments of the present disclosure will be described in detail based on the following figures, wherein:

FIG. 5 is a table showing a relationship between values of a non-volatile memory 52 and a computation of the computing circuit 60 in FIG. 1;

FIG. 6 is a table showing a first computing example in the circuit of FIG. 1;

FIG. 7 is a table showing a second computing example in the circuit of FIG. 1;

FIG. 8 is a table showing a third computing example in the circuit of FIG. 1;

DETAILED DESCRIPTION

The exemplary embodiments of the present disclosure are described and illustrated below to encompass bias voltage generation circuits, methods of manufacturing the same, and devices incorporating bias voltage generation circuits. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present disclosure. It should be noted that the drawings are solely for description and are not to limit the technical scope of the present invention.

Configuration of Driver IC of Exemplary Embodiment

Figure 2:
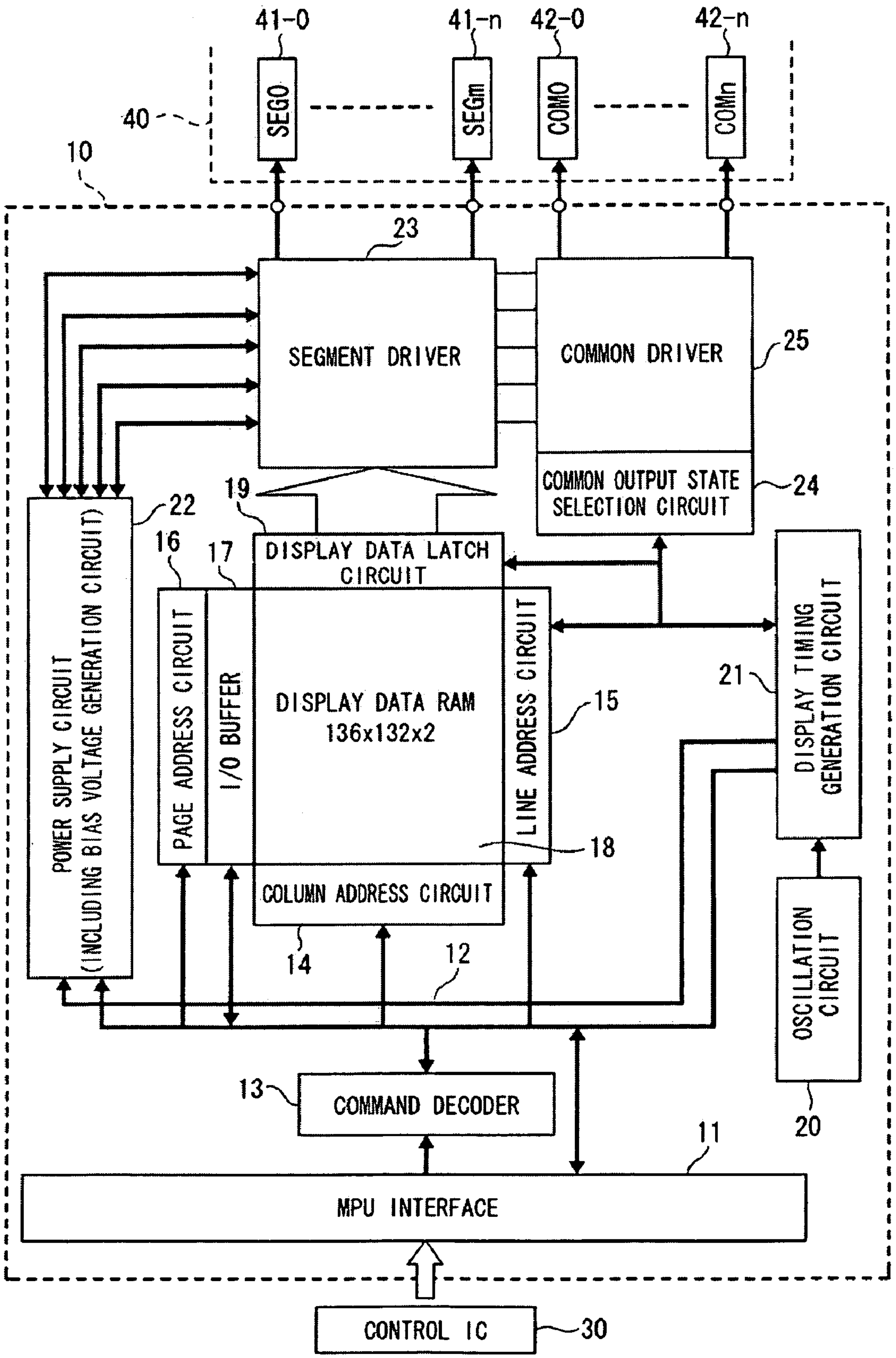
FIG. 2 is a schematic bock diagram of a driver IC including the bias voltage generation circuit according to the exemplary embodiment.

FIG. 2 is a schematic block diagram of a driver IC having a bias voltage generation circuit according to the exemplary embodiment.

A driver IC 10 is a circuit that is controlled by a control IC 30 having an MPU or the like and that drives a display panel 40 such as an LCD. In the driver IC 10, there is provided an MPU interface 11 that transmits and receives both display data and a control signal between the MPU interface 11 and the control IC 30. A bus 12 is connected to the MPU interface 11. A command decoder 13 that decodes a program is connected between the bus 12 and the MPU interface 11.

To the bus 12 are connected a column-address circuit 14 that selects a column-address, a line-address circuit 15 that selects a line-address, a page-address circuit 16 that selects a page-address, and an input/output (hereinafter, referred to as "I/O") buffer 17. A display data RAM 18 (with 136×132×2 bit structure, for example), which is a random access memory that is writable/readable any time and for storing display data. Further, the driver IC 10 is provided with an oscillation circuit 20. A synchronized clock signal generated by the oscillation circuit 20 is supplied to a display timing generation circuit 21. A display timing signal generated by the display timing generation circuit 21 is supplied to the line -address circuit 15, a display data latch circuit 19, a common output state selection circuit 24, and the bus 12. The display timing signal supplied to the bus 12 is sent to a power supply circuit 22 and the like.

The power supply circuit 22 is a circuit that generates plural levels of voltages for driving the display panel 40 and is provided with a bias voltage generation circuit according to the embodiment. The plural levels of voltages generated from the power supply circuit 22 are supplied to a segment driver 23 and a common driver 25. The output state of the common driver 25 is selected by the common output state selection circuit 24. Plural segment lines (SEG) 41-0 to 41-n in the display panel 40 are driven by the segment driver 23, and plural common lines (COM) 42-0 to 42-n in the display panel 40 are driven by the common driver 25.

Configuration of Bias Voltage Generation Circuit of Exemplary Embodiment

Figure 1:
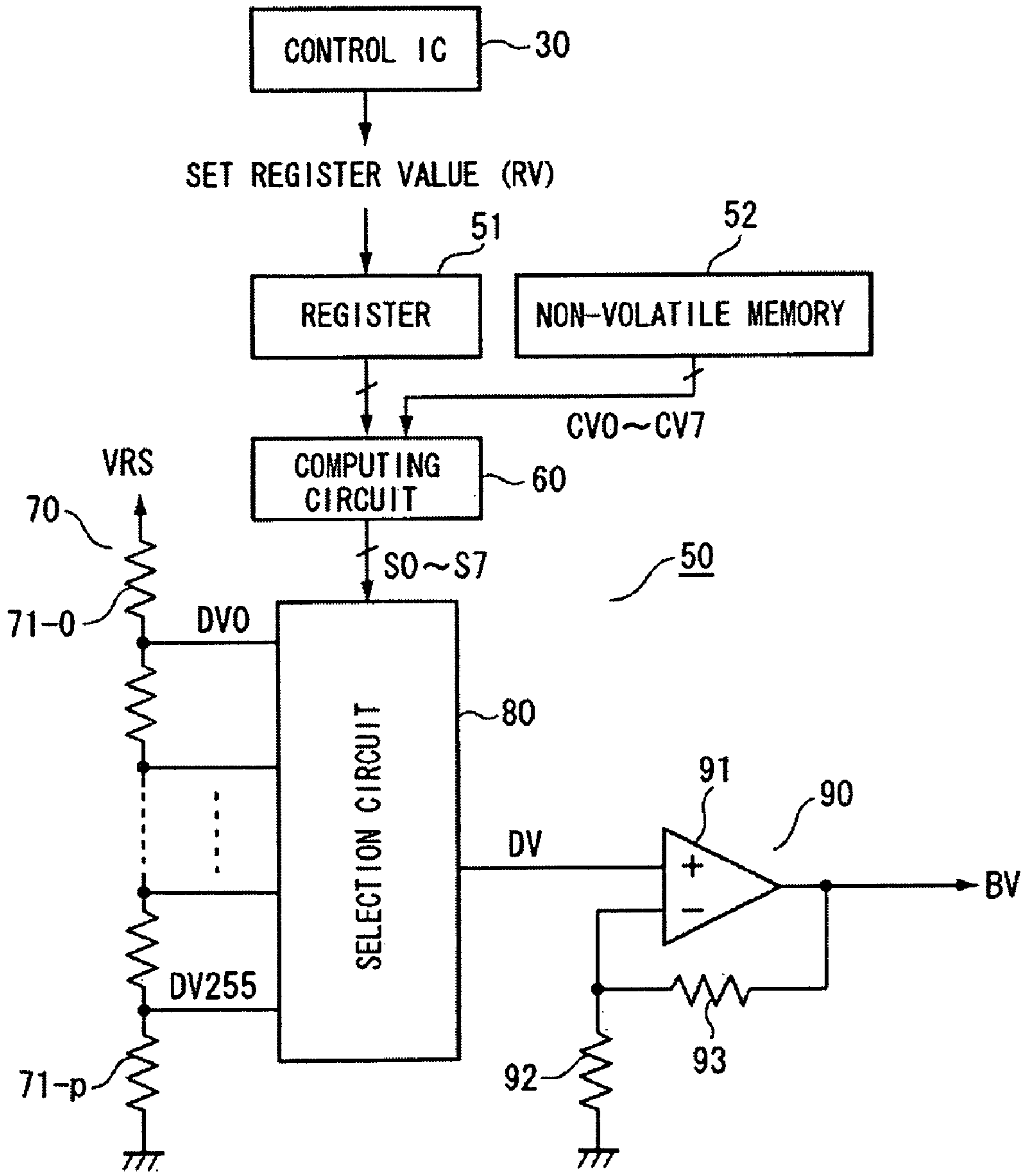
FIG. 1 is a schematic block diagram of a bias voltage generation circuit according to an exemplary embodiment.

FIG. 1 is a schematic block diagram showing the bias voltage generation circuit according to the exemplary embodiment.

The bias voltage generation circuit 50 is provided inside the power supply circuit 22 in FIG. 2, and includes a data holding section 51 (for example, a register) and a correction value storage section 52 (for example, a non-volatile memory such as an erasable programmable ROM (EPROM)). The data holding section 51 holds a variable n-bit (wherein n is a positive integer, for example 8-bit) data value (for example a register value) RV set from an external device (such as the control IC 30). The correction value storage section 52 stores an 8-bit correction value in which each one bit of the 8 bits are respectively referred to as CV0 to CV7 for correcting the 8-bit register value RV. A computing circuit 60 is connected to the output sides of the register 51 and the non-volatile memory 52. The computing circuit 60 is a circuit that computes the 8-bit register value RVs and the 8-bit correction value CV0 to CV7 (by an add-subtract operation using a complementary operation of 2) and outputs an 8-bit computing result in which each one bit of the 8 bits are respectively referred to as S0 to S7.

A voltage dividing circuit (for example, a resistance voltage dividing circuit) 70 is provided in the bias voltage generation circuit 50. The resistance-voltage dividing circuit 70 is a circuit that divides a reference voltage VRS (3V, for example) into $2^8$(=256) voltages using plural voltage-dividing resistors 71-0 to 71-p that are connected in series, and outputs 256 levels of divided voltages DV0 to DV255. A selection circuit 80 is connected to the resistance-voltage dividing circuit 70 and the computing circuit 60 at the output sides thereof. The selection circuit 80 is a circuit that selects one level of a divided voltage DV from the 256 levels of divided voltages DV0 to DV255 based on the 8-bit computing result S0 to S7.

An amplifier circuit (positive-phase amplifier circuit, for example) 90 is connected to the selection circuit 80 at the output side thereof as necessary. The amplifier circuit 90 is a circuit that amplifies the divided voltage DV and outputs a variable bias voltage BV having a variation over 256 levels, and includes an operational amplifier (hereinafter, referred to as "OP-amp") 91, an input resistor 92, and a feedback resistor 93.

Figure 3:
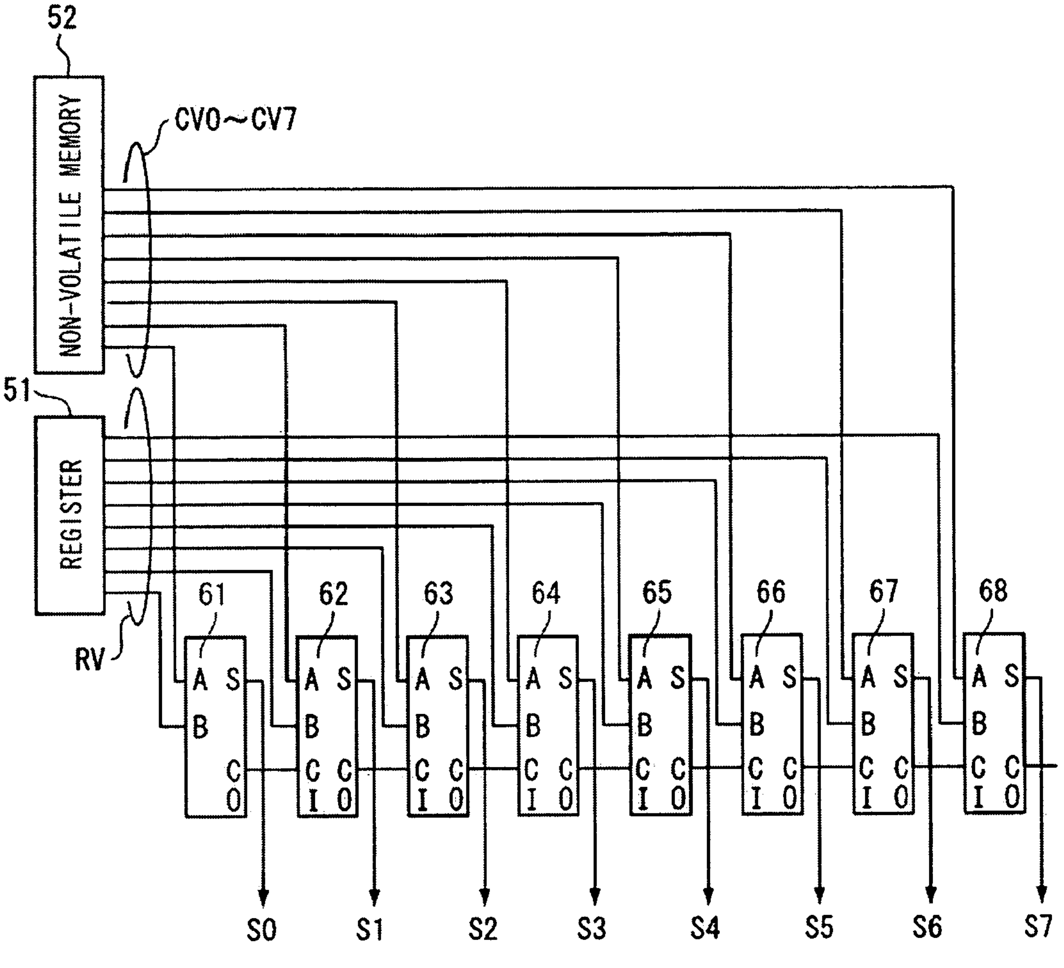
FIG. 3 is a block diagram of one example of a computing circuit 60 in FIG. 1.

FIG. 3 is a block diagram of one example of the computing circuit 60 in FIG. 1.

The computing circuit 60 performs an add-subtract operation using a complementary operation of 2 with respect to the 8-bit register value RV and the 8-bit correction value CV0 to CV7 and outputs the 8-bit computing result S0 to S7. The computing circuit 60 is arranged such that a half-adder 61 at the $1^{st}$ stage and full -adders 62 to 68 from the $2^{nd}$ to the $8^{th}$ stages are connected in a cascade (tandem) connection.

Figure 4:
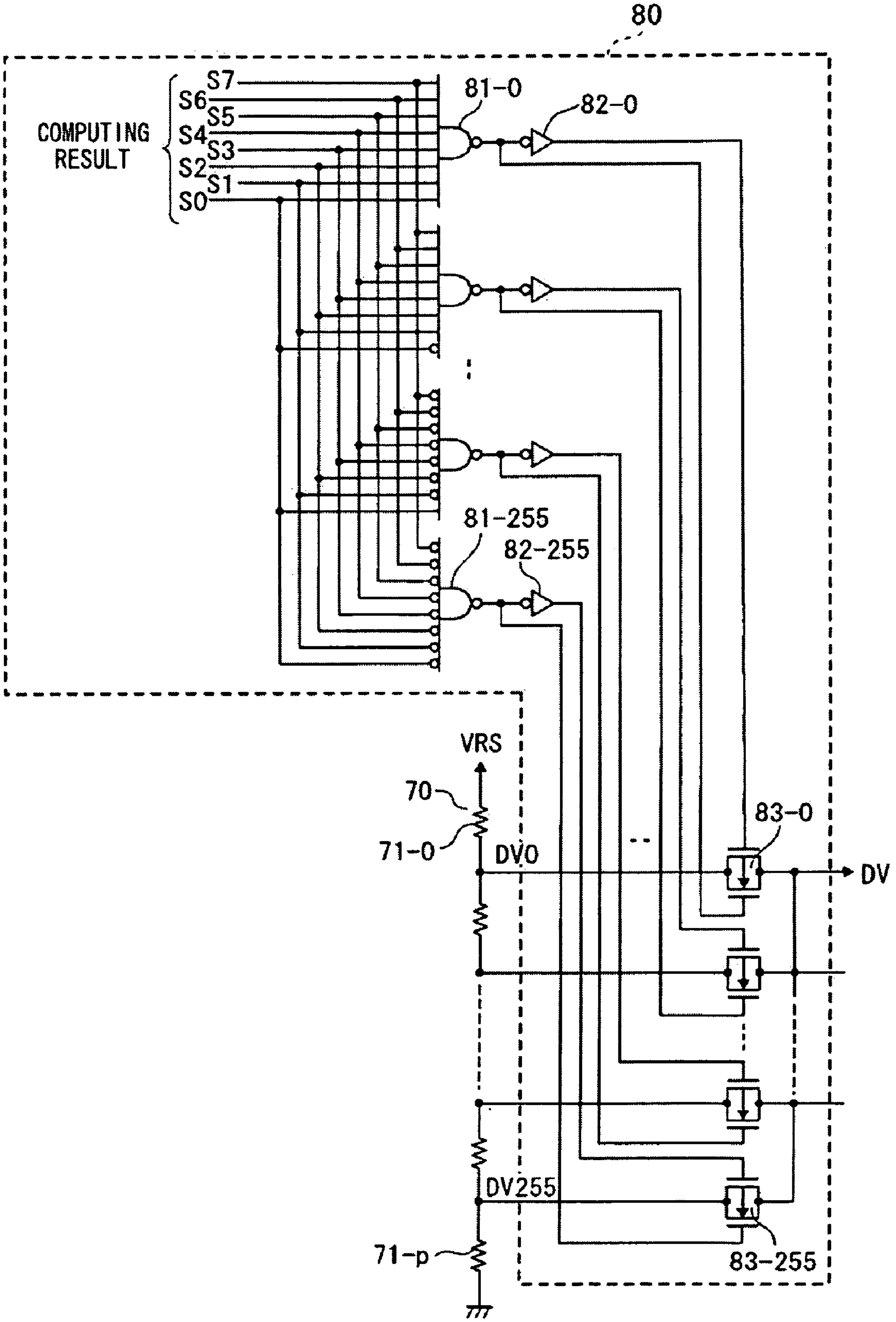
FIG. 4 is a block diagram of one example of a selection circuit 80 in FIG. 1.

FIG. 4 is a block diagram showing one example of the selection circuit 80 in FIG. 1.

The selection circuit 80 includes plural negative AND gates (hereinafter, referred to "NAND" gates) 81-0 to 81-255 that decode the 8-bit computing result S0 to S7 and plural signal inverters 82-0 to 82-255 that generate complementary signals from output signals of the NAND gates 81-0 to 81-255. Plural analog switches 83-0 to 83-255 are connected to the output side of the inverters 82-0 to 82-255. Each of the analog switches 83-0 to 83-255 is arranged such that a P-channel MOS transistor (hereinafter, referred to "PMOS") and an N-channel MOS transistor (hereinafter, referred to as "NMOS"), which on/off operations are performed in response to the complementary signals outputted from the inverters 82-0 to 82-255, are connected in parallel.

In response to the complementary signals outputted from the inverters 82-0 to 82-255, the analog switches 83-0 to 83-255 perform on/off operations to select one level of the divided voltage DV from the 256 levels of the divided voltages DV0 to DV255 which are outputs of the resistance-voltage dividing circuit 70.

Operation of Driver IC of Exemplary Embodiment

A schematic operation of the driver IC 10 shown in FIG. 2 is as follows.

When the driver IC receives display data for image display, and signals such as a control signal from the control IC 30 to the driver IC, the control signal is decoded by the command decoder 13 via the MPU interface 11, and is transmitted to the display timing generation circuit 21, the column-address circuit 14, the line-address circuit 15, the page-address circuit 16, and the power supply circuit 22 via the bus 12. The display data transmitted from the control IC 30 is sent to the MPU interface 11, the bus 12, and the I/O buffer 17, and is stored in the display data RAM 18 that is assigned by an address selected by the column-address circuit 14 and the line-address circuit 15.

Display data stored in the display data RAM 18 is latched at the display data latch circuit 19 and sent to the segment driver 23. In the power supply circuit 22, plural levels of the bias voltages BV are outputted from the bias voltage generation circuit 50 in FIG. 1. The output bias voltages BV are converted by a resistance-voltage dividing circuit and an amplifier circuit which are not shown, to different voltages, and sent to the segment driver 23 and the common driver 25 at a given timing in response to a display timing signal outputted from the display timing generation circuit 21. Plural levels of voltages are transmitted from the segment driver 23 and the common driver 25 to the segment lines 41-0 to 41-n and the common lines 42-0 to 42-n in the display panel 40 and the segment lines 41-0 to 41-n and the common lines 42-0 to 42-n are driven, whereby a desired image display is performed.

Operation of Bias Voltage Generation Circuit of Exemplary Embodiment

Figure 9:
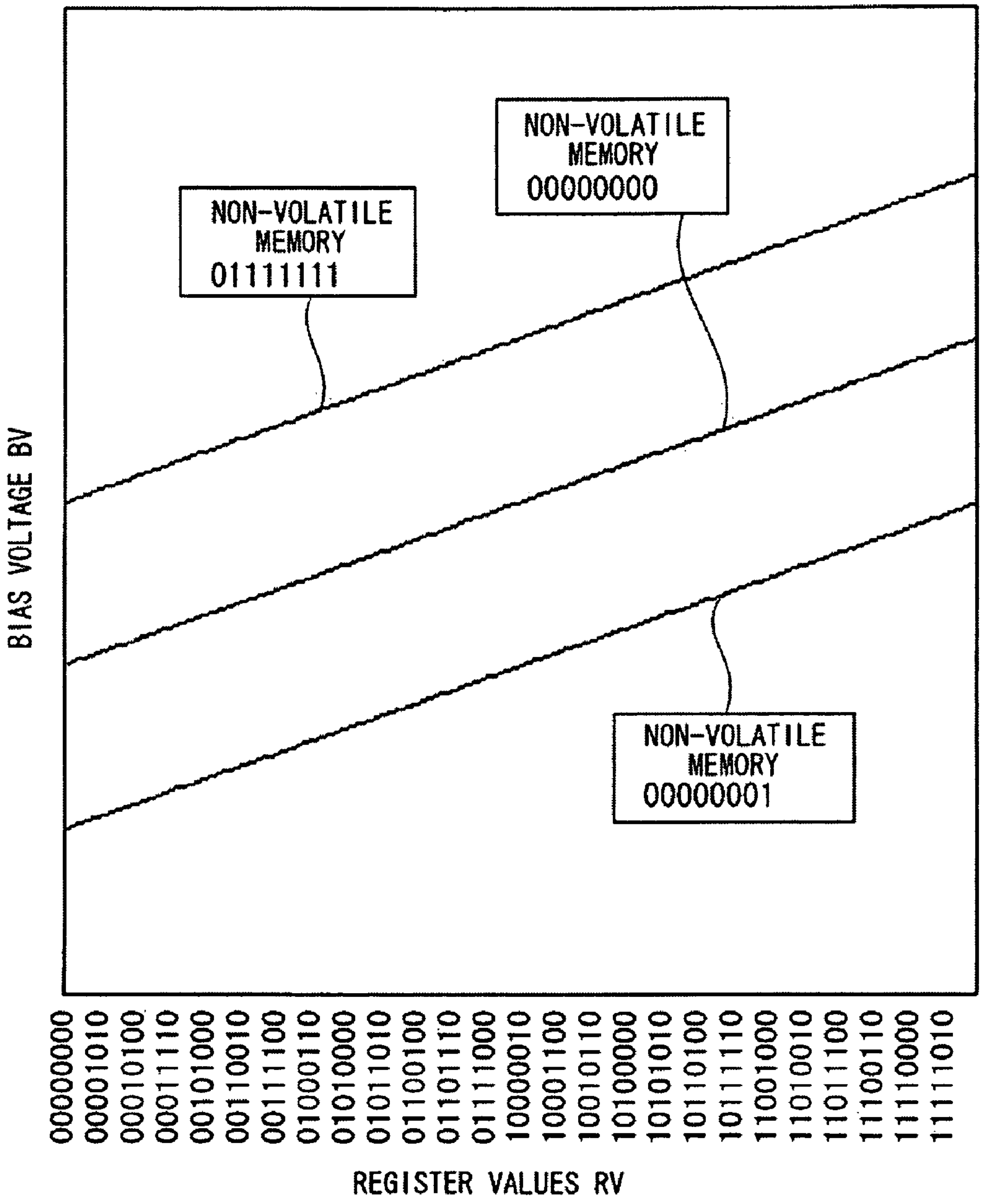
FIG. 9 is a graph showing a bias voltage BV that is outputted corresponding to register values set at the circuit of FIG. 1.
Figure 10:
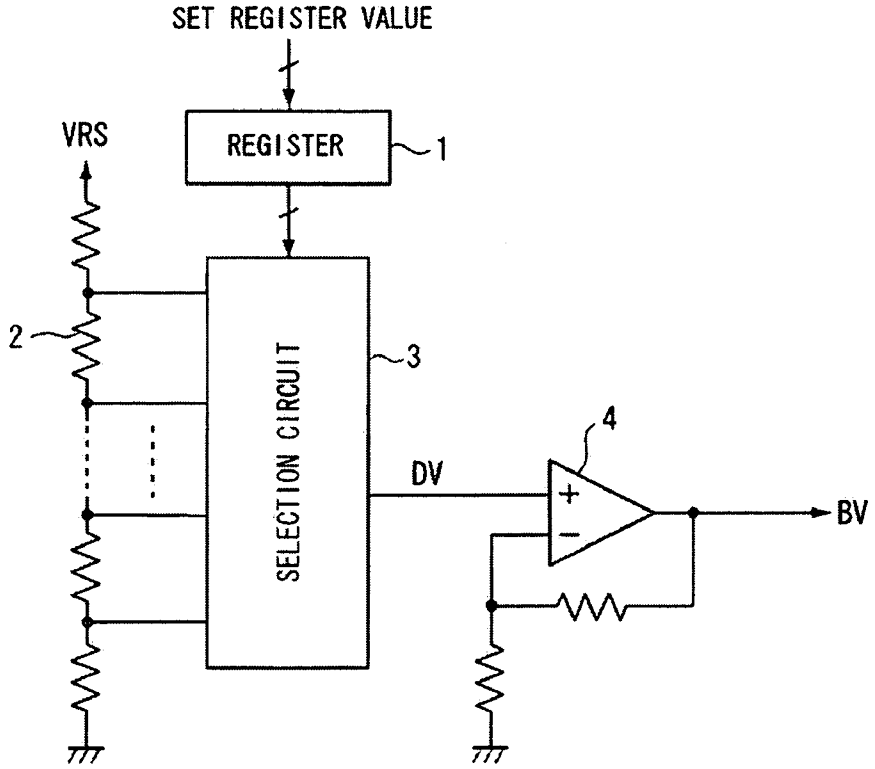
FIG. 10 RELATED ART
FIG. 10 is a schematic block diagram of a conventional bias voltage generation circuit.

FIG. 5 is a table showing a relationship between the non-volatile memory 52 values and computation of the computing circuit 60 in FIG. 1. FIGS. 6 to 8 respectively show first to third computing examples in the circuit of FIG. 1. Further, FIG. 9 is a graph showing the bias voltages BV which are outputted in correspondence with to the register values set at the circuit of FIG. 1.

When the control IC 30 sets the 8-bit register value RV to the register 51, as shown in FIG. 5, the computing circuit 60 performs an add-subtract operation using a complementary operation of 2 with respect to the 8-bit register value RV and the 8-bit correction value CV0 to CV7 stored in the non-volatile memory 52, and outputs the 8-bit computing result S0 to S7.

In the first computing example shown in FIG. 6, for example, when the correction value CV0 to CV7 of the non-volatile memory 52 is 00000000, the register value RV set at the register 51 are simply outputted as the computing result S0 to S7. In the second computing example shown in FIG. 7, when the correction value CV0 to CV7 of the non-volatile memory 52 is 00010000, a value in which 16 is added (+16) to the register value RV set at the register 51, is outputted as the computing result S0 to S7. In the third computing example 3 shown in FIG. 8, when the correction value CV0 to CV7 of the non-volatile memory 52 is 11110000, a value in which 16 is subtracted (−16) from the register value RV set at the register 51 is outputted as the computing result S0 to S7.

On the basis of the 8-bit computing result S0 to S7, the selection circuit 80 selects one level of a divided voltage DV from the 256 levels of divided voltages DV0 to DV255 outputted from the resistance-voltage dividing circuit 70, and outputs the selected divided voltage DV having a variation over 256 levels. The divided voltage DV is amplified by the amplifier circuit 90, and the bias voltage BV having a variation over 256 levels is outputted as shown in FIG. 9.

Thus, although before the mass-production and shipping of the driver IC 10, the non-volatile memory 51 is set to an empty state (blank state), since the correction value CV0 to CV7 can be stored (set) in the non-volatile memory 52 after completing the mass-production and shipping of the non-volatile memory 51, the bias voltage BV to be outputted can easily be changed by the same register value RV being set at the register 51.

The exemplary embodiment may realize the following operations (1) and (2):

By setting the correction value CV0 to CV7 in the non-volatile memory 52 in accordance with the display panel 40 to be used, a same register value RV can be set regardless of the display panel 40, and the required bias voltage BV can be outputted simply and accurately from the bias voltage generation circuit 50.

Figure 11:
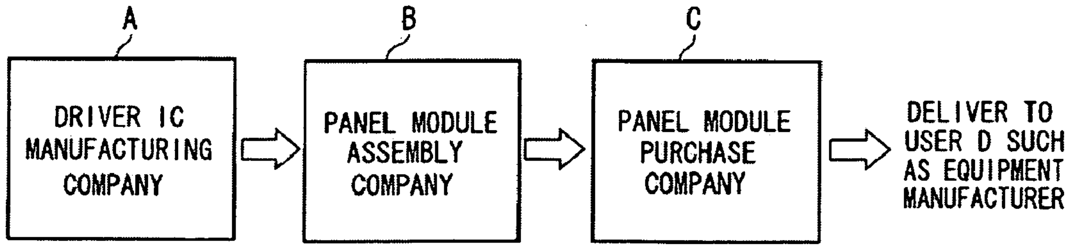
FIG. 11 RELATED ART
FIG. 11 is a workflow of mass-production and shipping of a conventional drive IC.

A particular operation which can be realized by the exemplary embodiment will be explained with reference to FIG. 11 showing the conventional operation.

Driver IC manufacturing company A can improve its production efficiency because the same register value RV can be set regardless, of the type of the display panel 40 with which the driver IC 10 is to be combined. Diver IC manufacturing company A may mass-produce the driver IC 10 in which the non-volatile memory 52 is set to be blank state and may ship them to Panel module assembly company B.

Panel module assembly company B sets the correction value CV0 to CV7 at the blank non-volatile memory 52 in the purchased driver IC 10 on the basis of the characteristics of the display panel 40 with which the driver IC 10 is combined, and may sale the obtained panel modules to Panel module purchase company C.

Panel module purchase company C may purchase the panel modules in which the bias voltage values have been already corrected, thereby the complicated task in the conventional workflow of changing the register value for each display panels will be unnecessary.

Modifications

The invention is not limited to the exemplary embodiment described above, and various embodiments and modifications are possible. Examples thereof include, but are not limited to, the following (a) and (b):

The bias voltage generation circuit 50 in FIG. 1 can be modified to another circuit configuration which is different from that shown in the drawings. For example, the amplifier circuit 90 may be omitted if it is unnecessary. Further, although the computation circuit 60 has been described as using the complementary computation of 2, even when adding circuit or subtracting circuit may be used for the computation circuit 60, substantially same operation can be achieved as in the exemplary embodiment The circuit configuration of the driver IC 10 shown in FIG. 2 may be modified to another which is different from that shown in the drawings. Further, the bias voltage generation circuit 50 according to the exemplary embodiment may be used in various circuits or devices other than the driver IC 10.

As described above, in accordance with the exemplary embodiment, data value set at the data holding section can be corrected easily and precisely on the basis of correction value stored in the correction value storage section. Accordingly, it is possible to generate corrected variable bias voltages easily with a comparatively simple circuit configuration.

Following from the above description, it should be apparent to those of ordinary skill in the art that, while the methods and apparatuses herein described constitute exemplary embodiments of the present disclosure and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the disclosure in order to fall within the scope of any claims, since the invention is defined by the claims and since inherent and/or unforeseen advantages of the present invention may exist even though they may not have been explicitly discussed herein.

What is claimed is:

1. A bias voltage generation circuit comprising:

a data holding section that holds a variable n-bit data value that is set from an exterior, wherein n is a positive integer;

a correction value storage section that stores an n-bit correction value for correcting the n-bit data value;

a computing circuit that processes the n-bit data value and the n-bit correction value, and outputs an n-bit computing result;

a voltage dividing circuit that divides a reference voltage into $2^n$ voltages, and outputs $2^n$ levels of divided voltages; and a selection circuit that selects one level of a divided voltage from the $2^n$ levels of divided voltages on the basis of the n-bit computing result, and outputs the selected divided voltage as a bias voltage, the output bias voltage having a variation over $2^n$ levels.

2. The bias voltage generation circuit according to claim 1, further comprising an amplifier circuit that amplifies the bias voltage outputted from the selection circuit.

3. The bias voltage generation circuit according to claim 1, wherein the data holding section comprises a data value the variable n-bit register value, and the correction value storage section comprises a memory storing the n-bit correction value.

4. The bias voltage generation circuit according to claim 3, wherein the memory comprises a non-volatile memory.

5. The bias voltage generation circuit according to claim 1, wherein the computing circuit performs any one of addition processing, subtraction processing, or addition/subtraction processing.

6. The bias voltage generation circuit according to claim 1, wherein the voltage dividing circuit comprises a resistance-voltage dividing circuit.

7. A driver integrated circuit comprising the bias voltage generation circuit according to claim 1.

8. The driver integrated circuit according to claim 7, wherein the driver integrated circuit is a circuit for driving a display device.

9. The driver integrated circuit according to claim 8, wherein the display device is a liquid crystal display device.

* * * * *